(12) United States Patent
Li (10) Patent No.: US 10,121,700 B2
(45) Date of Patent: Nov. 6, 2018

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Yong Li, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/809,120

(22) Filed: Nov. 10, 2017

(65) Prior Publication Data
US 2018/0130704 A1    May 10, 2018

(30) Foreign Application Priority Data
Nov. 10, 2016    (CN) .......................... 2016 1 0990039

(51) Int. Cl.
*H01L 21/768*    (2006.01)
*H01L 21/82*    (2006.01)
(Continued)

(52) U.S. Cl.
CPC .. *H01L 21/76858* (2013.01); *H01L 21/02164* (2013.01); *H01L 21/02236* (2013.01);
(Continued)

(58) Field of Classification Search
CPC ....... H01L 21/76858; H01L 21/823443; H01L 21/823835; H01L 21/28052; H01L 29/665; H01L 29/66507
See application file for complete search history.

(56) References Cited

U.S. PATENT DOCUMENTS

| | | |
|---|---|---|
| 2006/0035463 A1 | 2/2006 | Crank et al. |
| 2009/0280641 A1 | 11/2009 | Kang et al. |
| | (Continued) | |

OTHER PUBLICATIONS

The European Patent Office (EPO) The Extended European Search Report for 17200581.1 dated Apr. 26, 2018 9 Pages.

*Primary Examiner* — Thanhha Pham
(74) *Attorney, Agent, or Firm* — Anova Law Group, PLLC (57) ABSTRACT

Semiconductor devices and fabrication methods thereof are provided. An exemplary fabrication method includes providing a base substrate; forming gate structures over the base substrate; forming doped source/drain regions in the base substrate at two sides of each of the gate structures; forming an oxide layer on each of the doped source/drain regions; forming a metal layer on the oxide layer; and performing a reactive thermal annealing process, such that the metal layer reacts with a material of the oxide layer and a material of the doped source/drain regions to form a metal contact layer on each of the doped source/drain regions. The metal contact layer includes a first metal contact layer on the doped source/drain region, an oxygen-containing metal contact layer on the first metal contact layer, and a second metal contact layer on the oxygen-containing metal contact layer.

16 Claims, 5 Drawing Sheets

(51) Int. Cl.
*H01L 29/66* (2006.01)
*H01L 21/02* (2006.01)
*H01L 29/45* (2006.01)
*H01L 23/522* (2006.01)
*H01L 23/532* (2006.01)
*H01L 21/28* (2006.01)
*H01L 21/8234* (2006.01)
*H01L 21/8238* (2006.01)
*H01L 29/78* (2006.01)

(52) U.S. Cl.
CPC .. *H01L 21/28052* (2013.01); *H01L 21/76805* (2013.01); *H01L 21/76834* (2013.01); *H01L 21/76846* (2013.01); *H01L 21/823443* (2013.01); *H01L 21/823835* (2013.01); *H01L 23/5226* (2013.01); *H01L 23/53266* (2013.01); *H01L 29/456* (2013.01); *H01L 29/665* (2013.01); *H01L 29/66507* (2013.01); *H01L 21/76877* (2013.01); *H01L 29/785* (2013.01)

(56) References Cited

U.S. PATENT DOCUMENTS

| | | |
|---|---|---|
| 2014/0273366 A1 | 9/2014 | Lin et al. |
| 2015/0093871 A1 | 4/2015 | Li |
| 2015/0235956 A1 | 8/2015 | Lin et al. |
| 2015/0270179 A1* | 9/2015 | Alptekin ........... H01L 21/28512 257/757 |
| 2015/0270222 A1 | 9/2015 | Alptekin et al. |

* cited by examiner

SEMICONDUCTOR DEVICE AND FABRICATION METHOD THEREOF

CROSS-REFERENCES TO RELATED APPLICATIONS

This application claims the priority of Chinese patent application No. 201610990039.1, filed on Nov. 10, 2016, the entirety of which is incorporated herein by reference.

FIELD OF THE DISCLOSURE

The present disclosure generally relates to the field of semiconductor manufacturing technologies and, more particularly, relates to semiconductor devices and fabrication methods thereof.

BACKGROUND

With the continuous increase of the integration level of semiconductor devices on a chip, the critical dimensions of the semiconductor devices have become smaller and smaller. Correspondingly, there are some challenges. For example, the surface resistances and contact resistances of doped source/drain regions of semiconductor devices have correspondingly increased. The increase of the surface resistances and the contact resistances reduces the responding speed of the semiconductor devices and generates signal delays. Thus, interconnect structures with a low resistivity have become a key factor for manufacturing the semiconductor devices with a high integration level.

To reduce the contact resistances in the doped source/drain regions of the semiconductor devices, a metal contact layer is formed on each of the doped source/drain regions. The metal contact layer is made of metal silicide. The metal silicide has a relatively low resistance, and is able to significantly reduce the contact resistances of the doped source/drain regions. The metal silicide, self-aligned metal silicide and their fabrication methods have been widely used to reduce the surface resistances and the contact resistances of the doped source/drain regions of the semiconductor devices. Reducing the surface resistances and the contact resistances is able to reduce the delay time of the resistors and the capacitors.

However, there is a need to further improve the electrical properties of semiconductor devices. The disclosed methods and semiconductor structures are directed to solve one or more problems set forth above and other problems in the art.

BRIEF SUMMARY OF THE DISCLOSURE

One aspect of the present disclosure includes a method for fabricating a semiconductor device. The method includes providing a base substrate; forming gate structures over the base substrate; forming doped source/drain regions in the base substrate at two sides of each of the gate structures; forming an oxide layer on each of the doped source/drain regions; forming a metal layer on the oxide layer; and performing a reactive thermal annealing process, such that the metal layer reacts with a material of the oxide layer and a material of the doped source/drain regions to form a metal contact layer on each of the doped source/drain regions. The metal contact layer includes a first metal contact layer on the doped source/drain region, an oxygen-containing metal contact layer on the first metal contact layer, and a second metal contact layer on the oxygen-containing metal contact layer.

Another aspect of the present disclosure includes a semiconductor device. The semiconductor device includes a base substrate; gate structures over the base substrate; doped source/drain regions in the base substrate at two sides of each of the gate structures; and a metal contact layer on each of the doped source/drain regions. The metal contact layer includes a first metal contact layer on each of the doped source/drain regions, an oxygen-containing metal contact layer on the first metal contact layer, and a second contact layer on the oxygen-containing metal contact layer.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

The large parasitic external resistance ($R_{ext}$) of the semiconductor device may be one of the major reasons affecting the electrical properties of the semiconductor devices, especially for the fin field-effect transistor (FinFET) devices. With the continuous decrease of the device node, the adverse effect of the parasitic external resistance has become more and more obvious.

The major reason for having the parasitic external resistance is the contact resistances between the metal contact layers and the doped source/drain regions. The contact resistances are related to the Schottky barrier height (SBH) between the doped source/drain regions and the metal contact layers. When the Schottky barrier height (SBH) between the doped source/drain regions and the metal contact layers is reduced, the resistances between the metal contact layers and the doped source/drain regions are reduced. Correspondingly, the parasitic external resistance of the semiconductor device is reduced.

The present disclosure provides a semiconductor device and a fabrication method thereof. The fabrication method of the semiconductor device may include providing a base substrate having gate structures and sidewall spacers on the side surfaces of the gate structures. Doped source/drain regions may be formed in the base substrate at two sides of each of the gate structures, respectively. The fabrication method may also include forming an oxide layer on each of the doped source/drain regions; and forming a metal layer on the oxide layers. The fabrication method may also include performing a reactive thermal annealing process to allow the metal layer and the material of the doped source/drain regions to inter-diffuse through the oxide layer. For example, during this reactive thermal annealing process, chemical reactions may undergo between the metal layer and the oxide layer, and between the metal layer and the doped source/drain region. As such, the metal layer, the oxide layer and a top portion of the doped source/drain region may be converted into a metal contact layer on each of the doped source/drain regions. The metal contact layer may include a first metal contact layer on the doped source/drain region, an oxygen-containing metal contact layer on the first metal contact layer, and a second metal contact layer on the oxygen-containing metal contact layer.

In the present disclosure, the Schottky barrier height (SBH) between the doped source/drain regions and the metal contact layers may be reduced. Thus, the parasitic external resistance of the semiconductor device may be reduced; and the electrical properties of the semiconductor device may be improved.

Figure 7:
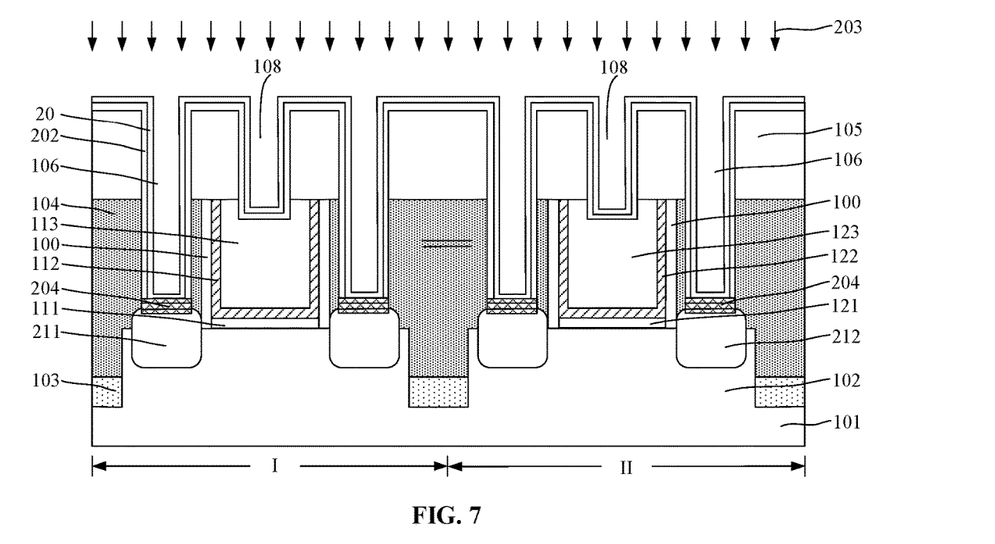
Figure 8:
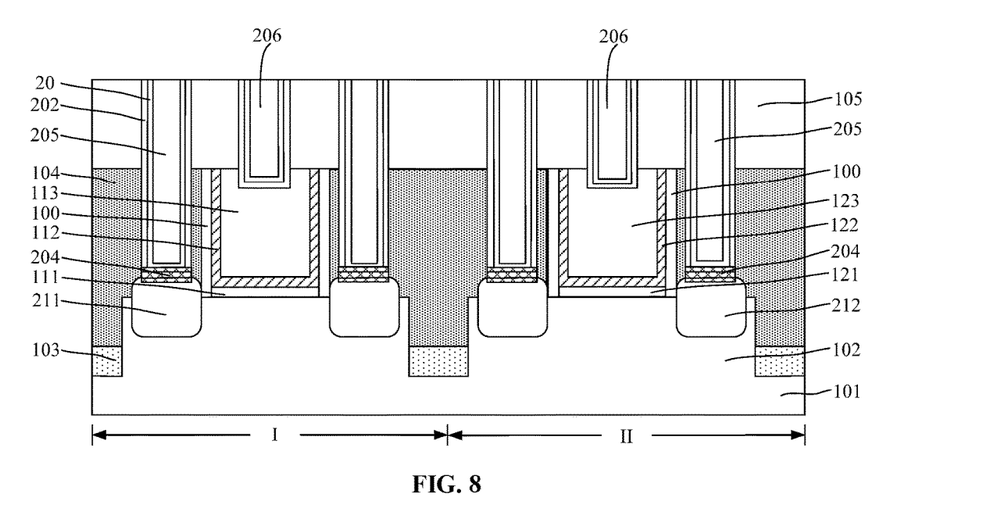
Figure 9:
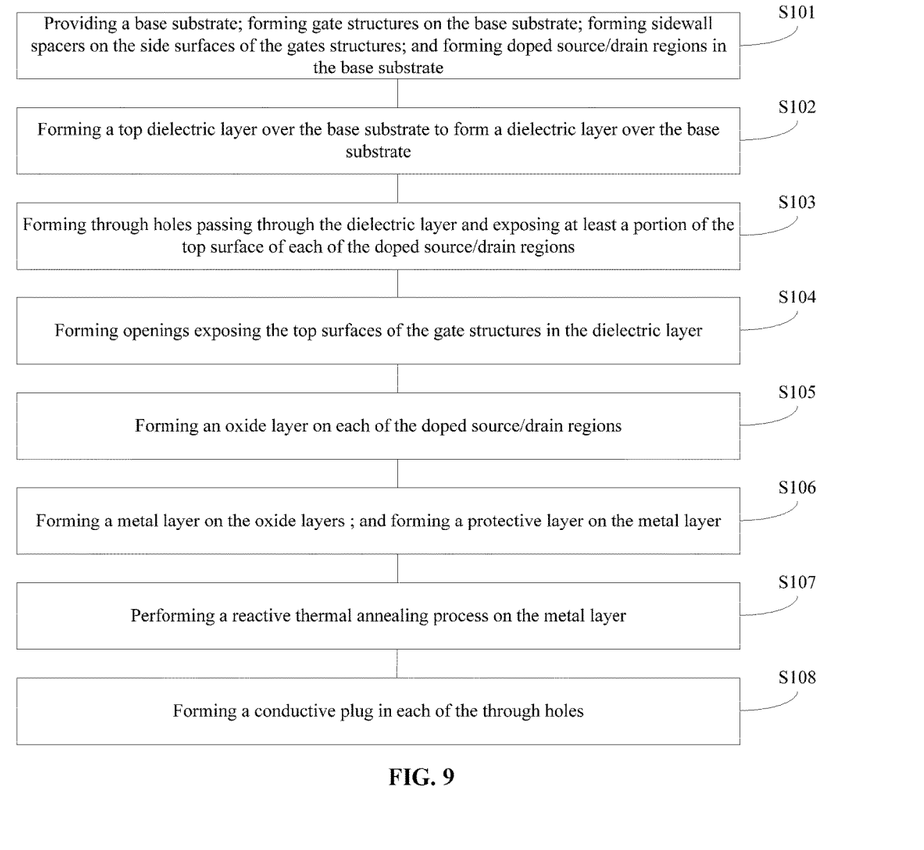
FIG. 9 illustrates an exemplary fabrication process of a semiconductor device consistent with the disclosed embodiments.

FIG. 9 illustrates an exemplary fabrication process of a semiconductor device consistent with the disclosed embodiments. FIGS. 1-8 illustrate semiconductor structures corresponding to certain stages of the exemplary fabrication process. For illustrative purposes, a gate-last process for forming the gate structures of the semiconductor device is described herein. In some embodiments, other processes, such as a gate-first process, may also be used to form the semiconductor device.

Figure 1:
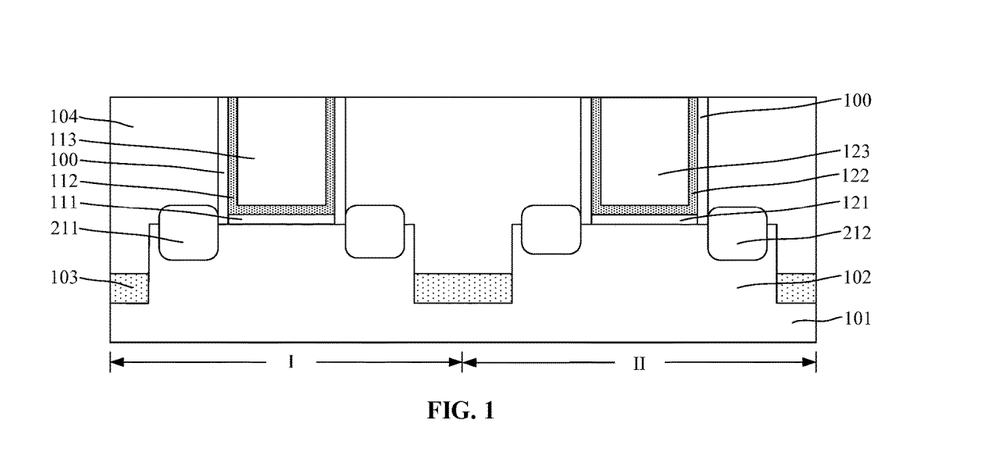
FIGS. 1-8 illustrate semiconductor structures corresponding to certain stages of an exemplary fabrication process of a semiconductor device consistent with the disclosed embodiments.

As shown in FIG. 9, at the beginning of the fabrication process, a base substrate is provided (S101). FIG. 1 illustrates a corresponding semiconductor structure.

As shown in FIG. 1, a base substrate is provided. Gate structures may be formed on the base substrate. Sidewall spacers may be formed on the side surfaces of each of the gate structures. Further, doped source/drain regions may be formed in the base substrate at two sides of each of the gate structures.

In one embodiment, the semiconductor device is an FinFET device. The base substrate may include a semiconductor substrate 101, a plurality of the discrete fins 102 formed on the semiconductor substrate 101, and an isolation structure 103 formed on the portion of the semiconductor substrate 101 exposed by the plurality of fins 102. The isolation structure 103 may cover portions of the side surfaces of the fins 102; and the top surface of the isolation structure 103 may be below the top surfaces of the fins 102. Further, sidewall spacers 100 may be formed on the side surfaces of the gate structures.

In some embodiments, the semiconductor device may be a planar device. Thus, the base substrate may be a planar substrate.

The semiconductor substrate 101 may be a silicon substrate, a germanium substrate, a silicon germanium substrate, a silicon carbide substrate, a silicon-on-insulator (SOI) substrate, a germanium-on-insulator (GOI) substrate, a gallium nitride substrate, a gallium arsenide substrate, or a gallium indium substrate, etc. The fins 102 may be made of silicon, germanium, silicon germanium, silicon carbide, gallium arsenide, or gallium indium, etc. In one embodiment, the semiconductor substrate 101 is a silicon substrate; and the fins 102 are made of silicon.

The isolation structure 103 may be used to electrically isolate adjacent fins 102. The isolation structure 103 may be made of an insulation material, such as silicon oxide, silicon nitride, silicon oxynitride, or silicon carbonoxynitride, etc. In one embodiment, the isolation structure 103 is made of silicon oxide.

Figure 2:
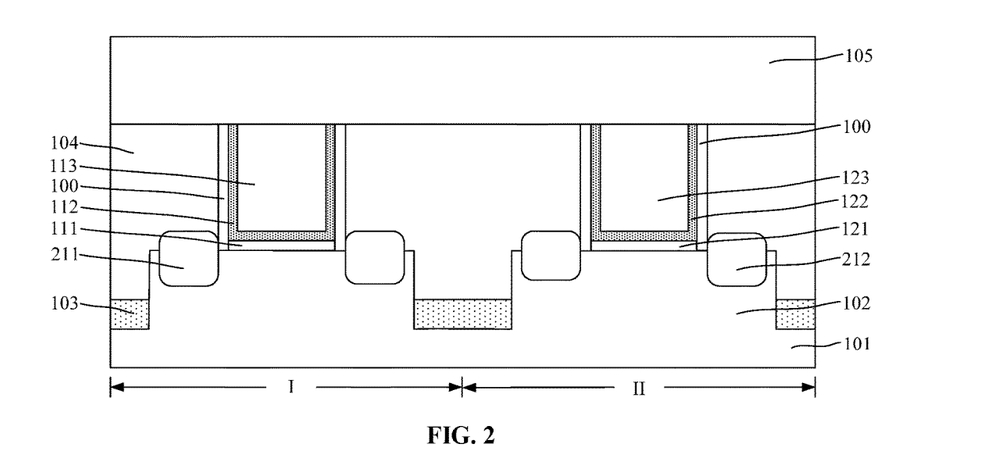

For illustrative purposes, the semiconductor device is a CMOS device. As shown in FIG. 2, the semiconductor substrate 101 may include an NMOS region I and a PMOS regions II. The NMOS region I may provide a process platform for forming an NMOS transistor. The PMOS region II may provide a process platform for forming a PMOS transistor. In some embodiments, the semiconductor substrate may only include an NMOS region or a PMOS region.

In some embodiments, the semiconductor device may be an NMOS device or a PMOS device.

The gate structures may be formed on the isolation structure 103 and may be across the plurality of fins 102. The gate structures may cover portions of side and top surfaces of the fins 102. In one embodiment, the gate structures may include a first gate structure in the NMOS region I and a second gate structure in the PMOS region II.

Referring to FIG. 1, the first gate structure may include a first high-K gate dielectric layer 111 and a first gate electrode layer 113 formed on the first high-K gate dielectric layer 111. The second gate structure may include a second high-K gate dielectric layer 112 and a second gate electrode layer 123 on the second high-K gate dielectric layer 112. The sidewall spacers 100 may be formed on the side surfaces of the first gate structure and the second gate structure.

The first high-K gate dielectric layer 111 and the second high-K gate dielectric layer 121 may be made of a high-K gate dielectric material. The high-K gate dielectric material refers to the material having a relative dielectric constant greater than the relative dielectric constant of silicon oxide. The high-K gate dielectric material may include $HfO_2$, $HfSiO$, $HfSiON$, $HfTaO$, $HfTiO$, $HfZrO$, $ZrO_2$, or $Al_2O_3$, etc. The first gate electrode layer 113 may be made of Cu, Al, or W, etc. The second gate electrode layer 123 may be made of Cu, Al, or W, etc.

To adjust the threshold voltages of the NMOS transistor and the PMOS transistor, an N-type work function layer 112 may be formed between the first high-K gate dielectric layer 111 and the first gate electrode layer 113; and a P-type work function layer 122 may be formed between the second high-K gate dielectric layer 121 and the second gate electrode layer 123. Further, an interface layer (not shown) may be formed between the first high-K gate dielectric layer 111 and the base substrate and between the second high-K gate dielectric layer 121 and the base substrate. The interface layer may be able to improve the interface property between the first high-K gate dielectric layer and the base substrate, and the interface property between the second high-K gate dielectric layer and the base substrate.

The interface layer may be made of any appropriate material. In one embodiment, the interface layer is made of silicon oxide.

The sidewall spacers 100 may be made of any appropriate material, such as silicon oxide, silicon nitride, or silicon oxynitride, etc. In one embodiment, the sidewall spacers 100 are made of silicon nitride.

Referring to FIG. 1, the doped source/drain regions may include first doped source/drain regions 211 formed in the base substrate in the NMOS region I at two sides of the first gate structure. Specifically, in one embodiment, the first doped source/drain regions 211 may be formed in the fin 102 in the NMOS region I at two sides of the first gate structure. The first doped source/drain regions 211 may be doped with N-type ions, such as P ions, As ions and Sb ions, etc. Further, the doped source/drain regions may also include second doped source/drain regions 212 formed in the base substrate in the PMOS region II at two sides of the second gate structure. Specifically, in one embodiment, the first doped source/drain regions 212 may be formed in the fin 102 at two sides of the second gate structure in the PMOS region II. The second doped source/drain regions 212 may be doped with P-type ions, such as B ions, Ga ions and In ions, etc.

In one embodiment, to increase the speed of the semiconductor device, the process for forming the first doped source/drain regions 211 may include etching the fin 102 at two sides of the first gate structure to form first trenches in the fin 102 at two sides of the first gate structure respectively with a certain depth; filling the first trenches with a first stress layer; and forming the first doped source/drain regions 211 by in situ doping the first stress layer during the process for forming the first stress layer. In some embodiments, a doping process may be performed to the first stress layer to form the first doped source/drain regions 211 after forming the first stress layer. The first stress layer may be made of SiC, or SiCP, etc.

The process for forming the second doped source/drain regions 212 may include etching the fin 102 at two sides of the second gate structure to form second trenches in the fin 102 at two sides of the second gate structure respectively with a certain depth; filling the second trenches with a second stress layer; and forming the second doped source/drain regions 212 by in situ doping the second stress layer during the process for forming the second stress layer. In some embodiments, a doping process may be performed to the second stress layer to form the second doped source/drain regions 212 after forming the second stress layer. The second stress layer may be made of SiGe, or SiGeB, etc.

Further, as shown in FIG. 1, in one embodiment, an interlayer dielectric layer 104 may be formed on the portion of the base substrate exposed by the gate structures; and the interlayer dielectric layer 104 may also expose the top surfaces of the gate structures. In one embodiment, the interlayer dielectric layer 104 is made of silicon oxide. In some embodiments, the interlayer dielectric layer may be made of silicon nitride, or silicon oxynitride.

In one embodiment, the process for forming the gate structures and the doped source/drain regions may include forming a first dummy gate structure across the fins 102 on the isolation structure 103 in the NMOS region I; forming a second dummy gate structure across the fins 102 on the isolation structure 103 in the PMOS region II; forming sidewall spacers 100 on the side surfaces of the first dummy gate structure and the second dummy gate structure; forming the first doped source/drain regions 211 in the base substrate in the NMOS region I at two sides of the first gate structure; forming the second doped source/drain regions 212 in the base substrate in the PMOS region II at two sides of the second gate structure; forming the interlayer dielectric layer 104 exposing the top surfaces of the first dummy gate structure and the second dummy gate structure on the base substrate exposed by the first dummy gate structure and the second dummy gate structure, and on the first doped source/drain regions 211 and the second doped source/drain regions 212; removing the first dummy gate structure to form a first opening; forming the first gate structure in the first opening; removing the second dummy gate structure to form a second opening; and forming the second gate structure in the second opening.

In some embodiments, the gate structures may be formed by a gate-first process. Before forming the doped source/drain regions, gate structures may be formed on the base substrate; and sidewall spacers may be formed on the side surfaces of the gate structures. Then, doped source/drain regions may be formed in the base substrate at two sides of the gate structures. Specifically, the process for forming the gate structures and the doped source/drain regions may include forming a first gate structure on the base substrate in the NMOS region; forming a second gate structure on the base substrate in the PMOS region; forming sidewall spacers on the side surfaces of the first gate structure and the second gate structure; forming first doped source/drain regions in the base substrate in the NMOS region at two sides of the first gate structure; and forming second doped source/drain regions in the base substrate in the PMOS region at two sides of the second gate structure.

The subsequent processes may include forming a dielectric layer on the base substrate exposed by the gate structures and on the gate structures. When the gate structures are formed by the gate-first process, after forming the doped source/drain regions and the gate structures, a dielectric layer may be directly formed on the base substrate exposed by the gate structures and on the top surfaces of the gate structures. The dielectric layer may be a single layer dielectric layer. In some embodiments, the dielectric layer may be a double-layer structure. The double-layer structure may include an interlayer dielectric layer on the base substrate and a top dielectric layer on the interlayer dielectric layer. The interlayer dielectric layer may level with the top surfaces of the gate structures; and the density of the interlayer dielectric layer may be greater than the density of the top dielectric layer.

Returning to FIG. 9, after providing the base substrate with the certain structures, a top dielectric layer may be formed (S102). FIG. 2 illustrates a corresponding semiconductor structure.

As shown in FIG. 2, a top dielectric layer 105 is formed on the interlayer dielectric layer 104 and the top surfaces of the gate structures. The interlayer dielectric layer 104 and the top dielectric layer may form a dielectric layer. The dielectric layer may be over the base substrate exposed by the gate structures and the top surfaces of the gate structures.

The top dielectric layer 105 may be made of silicon oxide, silicon nitride, or silicon oxynitride, etc. Various processes may be used to form the top dielectric layer 105, such as a chemical vapor deposition (CVD) process, a physical vapor deposition (PVD) process, or an atomic layer deposition (ALD) process, etc.

In one embodiment, the top dielectric layer 105 is formed by a CVD process. The top dielectric layer 105 is made of silicon oxide.

Figure 3:
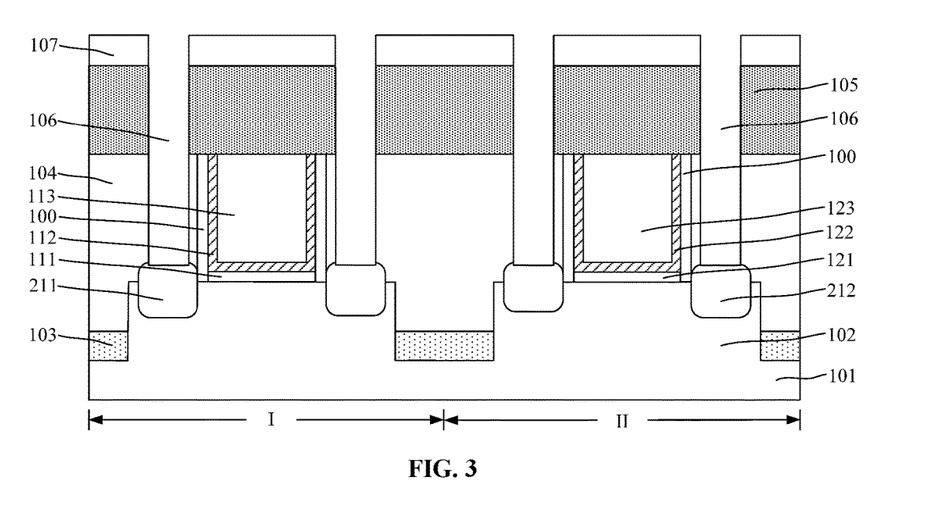

Returning to FIG. 9, after forming the top dielectric layer, through-holes may be formed (S103). FIG. 3 illustrates a corresponding semiconductor structure.

As shown in FIG. 3, through-holes 106 passing through the dielectric layer may be formed. The through-holes 106 may expose portions of, or entire top surfaces of the doped source/drain regions.

The through-holes 106 may provide a process platform for subsequently forming conductive plugs electrically connecting with the doped source/drain regions. Further, the through-holes 106 may also provide a process platform for subsequently forming metal contact layers connecting with the doped source/drain regions (e.g., a pre-clean process).

Some of the through-holes 106 may expose portions of, or entire top surfaces of the first doped source/drain regions 211. Other through-holes 106 may expose portions of, or entire top surfaces of the second doped source/drain regions 212.

In one embodiment, to prevent the through-holes 106 and the side surfaces of the first gate structure and/or the side surface of the second gate structure from having an electrical connection, the through-holes 106 may cover portions of the top surfaces of the doped source/drain regions. Specifically, the through-holes 106 may expose portions of the top surfaces of the first doped source/drain regions 211 and portions of the surfaces of the second doped source/drain regions 212.

In some embodiments, the through-holes may expose the entire surfaces of the doped source/drain regions.

Referring to FIG. 3, the process for forming the through-holes 106 may include forming a first photoresist layer 107, defining the positions and sizes of the through-holes 106, on the top dielectric layer 105; and etching the top dielectric layer 105 and the interlayer dielectric layer 104 to form the through-holes 106 passing through the dielectric layer 106. The through-holes 106 may expose the top surfaces of the first doped source/drain regions 211 and the top surfaces of the second doped source/drain regions 212.

In one embodiment, to ensure the through-holes 106 to expose the top surfaces of the doped source/drain regions, the doped source/drain regions may be over-etched during the process for etching the dielectric layer.

After forming the through-holes 106, the first photoresist layer 107 may be removed.

The dielectric layer may be etched by any appropriate process, such as a dry etching process, or a wet etching process, etc. The first photoresist layer 107 may be removed by any appropriate process, such as a dry etching process, a wet etching process, or a plasma ashing process, etc.

Figure 4:
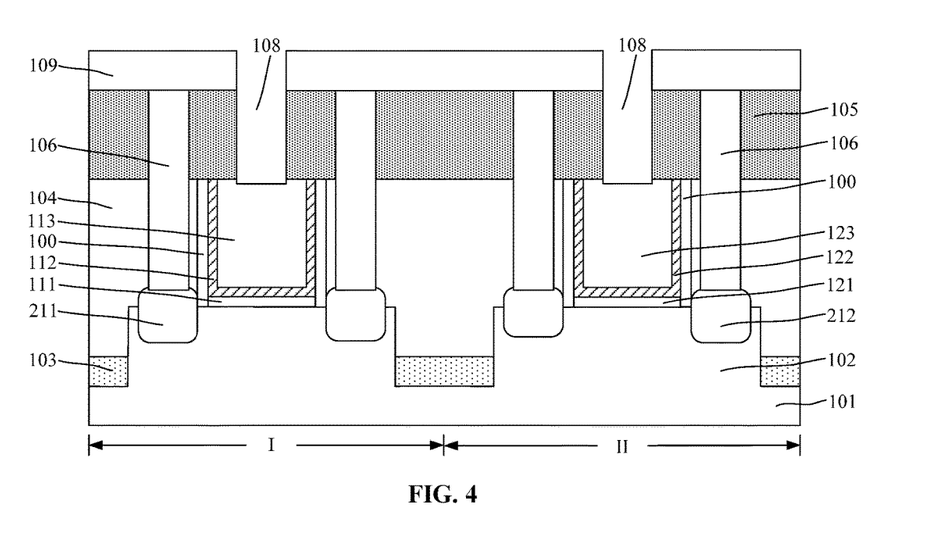

Returning to FIG. 9, after forming the through-holes 106, openings may be formed (S104). FIG. 4 illustrates a corresponding semiconductor structure.

As shown in FIG. 4, openings 108 exposing the top surfaces of the gate structures may be formed. Specifically, each opening may expose one gate structure. The openings 108 provide a process platform for subsequently forming gate plugs electrically connecting with the gate electrode layers of the gate structures. Such a process may be referred to as an open gate process.

Specifically, one opening 108 may expose the top surface of the first gate structure. That is, the opening 108 may expose the first gate electrode layer 113 of the first gate structure. Another opening 108 may expose the top surface of the second gate structure. That is, the opening 108 may expose the second gate electrode layer 123 of the second gate structure.

Referring to FIG. 4, the process for forming the openings 108 may include forming a second photoresist layer 109 defining the positions and sizes of the openings 108 on the top dielectric layer 105; and etching through the top dielectric layer 105 to form the openings 108 using the second photoresist layer 109 as an etching mask. The openings 108 may pass through the top dielectric layer 105; and the bottoms of the openings 108 expose the top surfaces of the gate structures.

After forming the openings 108, the second photoresist layer 109 may be removed.

The top dielectric layer 105 may be etched by any appropriate process, such as a dry etching process, or a wet etching process, etc. The second photoresist layer 109 may be removed by any appropriate process, such as a dry etching process, a wet etching process, or a plasma ashing process, etc.

Figure 5:
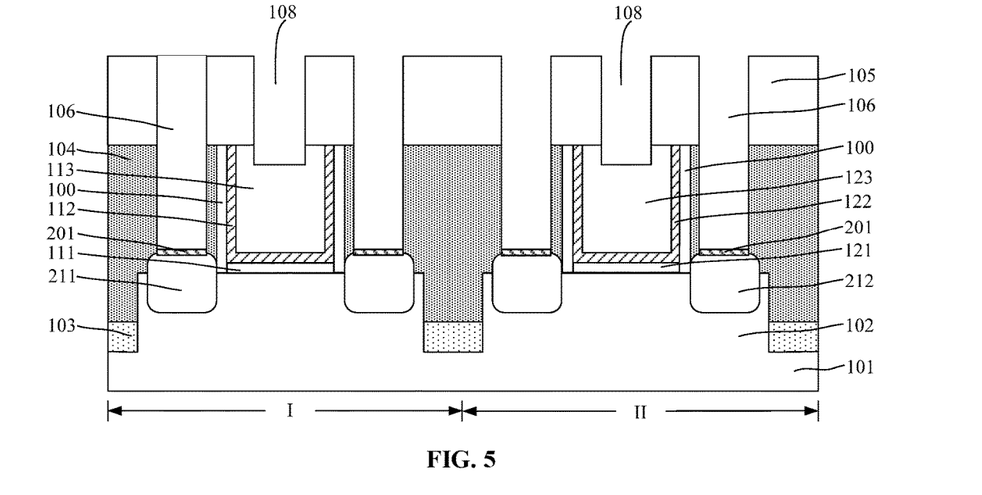

Returning to FIG. 9, after forming the openings, oxide layers may be formed (S105). FIG. 5 illustrates a corresponding semiconductor structure.

As shown in FIG. 5, an oxide layer 201 is formed on each of the doped source/drain regions.

In one embodiment, the oxide layers 201 may be formed on the doped source/drain regions exposed by the bottoms of the through-holes 106. Specifically, the oxide layers 201 may be formed on the first doped source/drain regions 211 exposed by the through-holes 106 and the second doped source/drain regions 212 exposed by the through-holes 106.

Various processes may be used to form the oxide layers 201. In one embodiment, the oxide layers 211 are formed by performing an oxidation process to the doped source/drain regions. The oxide layers 211 formed by oxidizing the doped source/drain regions may have a desired interface property with the doped source/drain regions. Thus, the quality of the subsequently formed metal contact layers may be improved.

The oxide layers 201 may be made of any appropriate material. In one embodiment, the oxide layers 201 are made of silicon oxide.

The thickness of the oxide layers 201 may be any appropriate value. If the oxide layers 201 are too thin, the subsequently formed oxygen-containing metal contact layers may be relatively thin; and the content of oxygen in the oxygen-containing metal contact layers may be relatively small. Thus, the improvement of the contact resistance may be limited. If the oxide layers 201 are too thick, during the subsequent thermal annealing process, the inter-diffusion between the metal layers and the doped source/drain regions may be difficult. Thus, in one embodiment, the thickness of the oxide layers 201 may be in a range of approximately 5 Å-30 Å.

The oxidation process may be any appropriate process. In one embodiment, the oxidation process is a chemical soaking method. When the chemical soaking process is used to form the oxide layer 201, the controllability of the thickness of the oxide layers 201 may be as desired.

In one embodiment, a mixture solution of sulfuric acid and hydrogen peroxide is used to perform the chemical soaking process to the doped source/drain regions to form the oxide layers 201. The volume ratio of sulfuric acid and hydrogen peroxide may be in a range of approximately 1:1 to 1:5. The temperature of the mixture solution may be in a range of approximately 120° C.-180° C.

In another embodiment, a mixture solution of ammonia and hydrogen peroxide is used to perform the chemical soaking process to the doped source/drain regions to form the oxide layers. The volume ratio of ammonia and hydrogen peroxide may be in a range of approximately 1:4 to 1:15. The temperature of the mixture solution may be in a range of approximately 25° C.-45° C.

In some embodiments, ozone-containing deionized (DI) water may be used to perform the chemical soaking process.

In one embodiment, the oxidation process for forming the oxide layers 201 may be unable to oxidize the top surfaces of the first gate structures and the second gate structures. That is, the unnecessary oxidation on the top surface of the first gate electrode layer 113 and the top surface of the second gate electrode layer 123 may be avoided.

Figure 6:
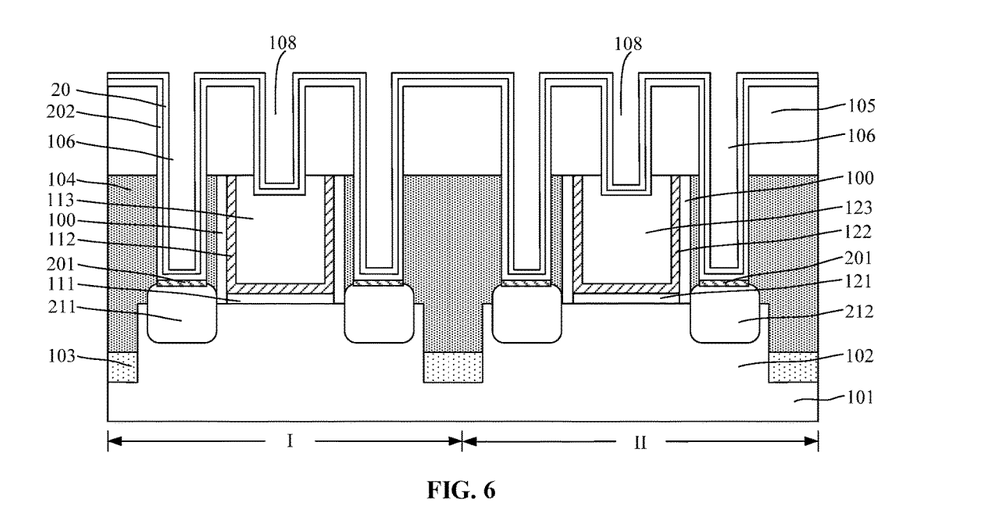

Returning to FIG. 9, after forming the oxide layers, a metal layer may be formed (S106). FIG. 6 illustrates a corresponding semiconductor structure.

As shown in FIG. 6, a metal layer 202 is formed on the oxide layers 201. In one embodiment, during the process for forming the metal layer 202, the metal layer 202 may also be formed on the side surfaces of the through-holes 106 and the top surface of the dielectric layer. The metal layer 202 may also be formed on the bottom surfaces and side surfaces of the openings 108.

The metal layer 202 may provide metal atoms for subsequently forming first metal contact layers, oxygen-containing metal contact layers, and second metal contact layers.

The metal layer 202 may be made of any appropriate material, such as one or more of Ni, W, Ti, Ta, Pt, and Co, etc. Various processes may be used to form the metal layer 202, such as a physical vapor deposition (PVD) process, a sputtering process, or an ALD process, etc.

In one embodiment, the metal layer 202 is made of Ti. The thickness of the metal layer 202 may be in a range of approximately 50 Å-200 Å.

When Ti is used as the material of the metal layer 202, after subsequently performing a reactive thermal annealing process, the remaining, unreacted metal layer 202 may not need to be removed. Thus, the metal layer 202 may be retained on the side and bottom surfaces of the openings 108; and the process may be simplified. Further, the portions of the metal layer 202 on the bottom surfaces and side surfaces of the openings 108 may function as adhesive layers; and the portions of the metal layer 202 on the side surfaces of the through-holes 106 may also function as adhesive layers.

In one embodiment, as shown in FIG. 6, to prevent the material of the metal layer 202 from being oxidized by $O_2$ in the environment, after forming the metal layer 202, a protective layer 20 (i.e., a capping layer) may be formed on the metal layer 202. The protective layer 20 may isolate the metal layer 202 from $O_2$. The protective layer 20 may be made of any appropriate material, such as TiN, or TaN, etc.

During the subsequent process for forming conductive plugs, the protective layer 20 may also function as an adhesive layer.

Returning to FIG. 9, after forming the protective layer, a reactive thermal annealing process may be performed (S107). FIG. 7 illustrates a corresponding semiconductor structure.

As shown in FIG. 7, a reactive thermal annealing process 203 is performed on the metal layer 202. The reactive thermal annealing process 203 may cause the metal layer 202 and the material of the doped source/drain regions to inter-diffuse and have a chemical reaction to form a metal contact layer 204 on each of the doped source/drain regions. The metal contact layer 204 may include a first metal contact layer (not labeled) on the doped source/drain regions, an oxygen-containing metal contact layer (not labeled) on the first metal contact layer, and a second metal contact layer (not labeled) on the oxygen-containing metal contact layer.

In one embodiment, the metal contact layers 204 may be used to reduce the contact resistance of the semiconductor device. The metal contact layers 204 may be on the doped source/drain regions exposed by the through-holes 106. Specifically, the first metal contact layers of the metal contact layers 204 may be on the first doped source/drain regions 211 and the second doped source/drain regions 212 exposed by the through-holes 106.

Taking the metal layer 202 being made of Ti as an example, during the reactive thermal annealing process, Ti ions may diffuse into the doped source/drain regions through the oxide layers 201 (referring to the FIG. 6) on the doped source/drain regions. The Si ions in the doped source/drain regions may react with the Ti ions to form titanium silicide. Further, the Si ions in the doped source/drain regions may diffuse into the metal layer 202 through the oxide layers 201 (referring to FIG. 6); and the Ti ions in the metal layer 202 may react with the Si ions to form titanium silicide. At the same time, the Ti ions in the metal layer 202 and the Si ions in the doped source/drain regions may diffuse into the oxide layers 201 to turn the oxide layers 201 into the oxygen-containing metal contact layers.

During the reactive thermal annealing process 203, because of the barrier function of the oxide layers 201, the reaction rate of the reactive thermal annealing process 203 may be reduced. Thus, the generation rate of the metal contact layers 204 may be reduced. The thickness of the formed metal contact layers 204 may be more uniform. The effect of the metal contact layer 204 for reducing the contact resistance of the semiconductor device may be as desired.

In one embodiment, the metal contact layer 204 may include a first metal contact layer, an oxygen-containing metal contact layer on the first metal contact layer, and a second metal contact layer on the oxygen-containing metal contact layer. The first metal contact layer may be made of titanium silicide; the oxygen-containing metal contact layer may be made of titanium oxysilicide (Ti—O—Si); and the second metal contact layer may be made of titanium silicide.

Because the oxygen-containing metal contact layer may be formed between the first metal contact layer and the second metal contact layer, the formed metal contact layer 204 may have dipoles. The dipoles may contribute to reduce the Schottky barrier height (SBH) between the metal contact layers 204 and the doped source/drain regions. Thus, the contact resistances between the metal contact layers 204 and the doped source/drain regions may be reduced. Accordingly, the parasitic external resistance of the semiconductor device may be reduced.

Further, because the oxide layers 201 may be formed on the doped source/drain regions 201. The oxide layers 201 may prevent the native oxide layers from forming on the source/drain regions. Thus, the process margin may be increased. Accordingly, the waiting time between the process for forming the oxide layers 201 and the process for forming the metal layer 202 may be increased.

The reactive thermal annealing process 203 may be any appropriate process, such as a laser thermal annealing process, a spike thermal annealing process, or a millisecond thermal annealing process, etc. In one embodiment, a laser thermal annealing process is used to perform the reactive thermal annealing process 203.

The temperature of the reactive thermal annealing process 203 may be any appropriate value. If the temperature of the thermal annealing process 203 is too low, the silicide scale of the metal contact layers 204 may be relatively low, the resistivity of the metal contact layers 204 may be relatively high. If the temperature of the reactive thermal annealing process 203 is too high, the properties of the metal contact layers 204 may change under the high temperature; and the quality of the metal contact layers 204 may not be as desired.

In one embodiment, the laser thermal annealing process is used to perform the reactive thermal annealing process 203. The temperature of the reactive thermal annealing process 203 may be in a range of approximately 800° C.-880° C., such as 800° C., 850° C., or 880° C.

After performing the reactive thermal annealing process 203, the metal layer 202 and the protective layer 20 on the side surfaces of the through-holes 106 may be retained. When conductive plugs are subsequently formed by filling the through-holes 106, the metal layer 202 and the protective layer 20 on the side surfaces of the through-holes 106 may increase the adhesion between the conductive plugs and the dielectric layer.

Further, after performing the reactive thermal annealing process 203, the metal layer 202 and the protective layer 20 on the side and bottom surfaces of the openings 108 may also be retained. When gate plugs are subsequently formed by filling the openings 108, the metal layer 202 and the protective layer 20 on the side surfaces of the openings 108 may increase the adhesion between the gate plugs and the dielectric layer.

Returning to FIG. 9, after performing the reactive thermal annealing process (referring to FIG. 7), conductive plugs may be formed (S108). FIG. 8 illustrates a corresponding semiconductor structure.

As shown in FIG. 8, a conductive plug 205 is formed on each of the second metal contact layer. The conductive plugs 205 may fill the through-holes 206 (referring to FIG. 7).

In one embodiment, during the process for forming the conductive plugs 205, a gate plug 206 may be formed in each of the openings 108 (referring to FIG. 7). The gate plugs 206 may fill the openings 108. The gate plug 206 may electrically connect with the first gate structure. The gate plug 206 may also electrically connect with the second gate structure.

The conductive plugs 205 may be made of any appropriate material, such as Cu, Al, or W, etc. In one embodiment, the conductive plugs 205 are made of W.

The process for forming the conductive plugs 205 may include forming a conductive film to fill the through-holes 106 and the openings 108 and on the top surface of the dielectric layer; and performing a planarization process to remove the portion of the conductive film above the dielectric layer. Thus, the conductive plugs 205 filling the through-holes 106 and the gate plugs 206 filling the openings 108 may be formed.

During the planarization process, the portion of the protective layer 20 above the dielectric layer and the portion of the metal layer 203 above the dielectric layer may also be removed.

The gate-last process is described herein. In some embodiments, a gate-first process may be used to form the gate structures. Correspondingly, the process for forming the gate structures and the doped source/drain regions may include forming gate structures on the base substrate; forming the sidewall spacers on the side surfaces of the gate structures; and forming doped source/drain regions in the base substrate at two sides of each of the gate structures, respectively.

In the disclosed embodiments, the oxide layers and the metal layer may be formed after forming the through-holes exposing the doped source/drain regions. In some embodiments, the oxide layers and the metal layer may be formed firstly, then the through-holes exposing the source/drain regions may be formed. Specifically, after the reactive thermal annealing process, the interlayer dielectric layer may be formed on the base substrate exposed by the gate structures and on the gate structures. Then, the through-holes may be formed by etching through the interlayer dielectric layer. The through-holes may expose the surfaces of the second metal contact layers. Then, the conductive plugs may be formed in the through-holes.

Thus, the present disclosure also provides a semiconductor device. FIG. 8 illustrates an exemplary semiconductor device.

As shown in FIG. 8, the semiconductor device includes a base substrate. Gate structures may be formed on the base substrate; and sidewall spacers may be formed on the side surfaces of the gate structures. Doped source/drain regions may be formed in base substrate at two sides of each of the gate structures. Further, the semiconductor device may also include a metal contact layer 204 formed on each of the doped source/drain regions. The metal contact layer 204 may include a first metal contact layer, an oxygen-containing metal contact layer on the first metal contact layer, and a second metal contact layer on the oxygen-containing metal contact layer.

In one embodiment, the base substrate may include a semiconductor substrate 101, a plurality of discrete fins 102 formed on the semiconductor substrate, and an isolation structure 103 formed in the semiconductor substrate 101 exposed by the fins 102. The isolation structure 103 may cover portions of the side surfaces of the fins 102; and the top surface of the isolation structure 103 may be below the top surfaces of the fins 102.

The gate structures may be on the isolation structure 103, and may be across the fins 102. Further, the gate structures may cover portions of the side and top surfaces of the fins 102.

For illustrative purposes, the semiconductor substrate may be a CMOS device. The base substrate may include an NMOS region I and a PMOS region II. Correspondingly, the gate structures may include a first gate structure in the NMOS region I and a second gate structure in the PMOS region II.

The first gate structure may include a first high-K gate dielectric layer 111 and a first gate electrode layer 113 on the first high-K gate dielectric layer 111. The second gate structure may include a second high-K gate dielectric layer 121 and a second gate electrode layer 123 on the second high-K gate dielectric layer 121.

Further, an N-type work function layer 112 may be formed between the first high-K gate dielectric layer 111 and the first gate electrode layer 113. A P-type work function layer 122 may be formed between the second high-K gate dielectric layer 121 and the second gate electrode layer 123.

The doped source/drain regions may include first doped source/drain regions 211 in the base substrate at two sides of the first gate structure in the NMOS region I and second doped source/drain regions 212 in the base substrate at two sides of the second gate structure in the PMOS region II. The first doped source/drain regions 211 may be in the fin 102 in the NMOS region I; and the second doped source/drain regions 212 may be in the fin 102 in the PMOS region II.

In one embodiment, the semiconductor device may also include an interlayer dielectric layer 104 on the portion of the base substrate exposed by the gate structures. The interlayer dielectric layer 104 may expose the top surfaces of the gate structures.

The first metal contact layer may be made of titanium silicide. The oxygen-containing metal contact layer may made of titanium oxysilicide. The second metal contact layer may be made of titanium silicide. The oxygen-containing metal contact layer may be between the first metal contact layer and the second metal contact layer. Thus, dipoles may be generated in the metal contact layers 204. The dipoles may be able to reduce the Schottky barrier height (SBH) between the metal contact layers 204 and the doped source/drain regions. Thus, the contact resistance between the metal contact layers 204 and the doped source/drain regions may be reduced. Accordingly, the external parasitic resistance of the semiconductor device may be reduced.

In one embodiment, the semiconductor device may also include a top dielectric layer 105 on the interlayer dielectric layer 104 and the top surface of the gate structures, conductive plugs 205 passing through the top dielectric layer 105 and the interlayer dielectric layer 104 and electrically connected with the metal contact layer 204, and gate plugs 206 passing through the top dielectric layer 105 and electrically connected with the gate structures. The detailed structures and intermediate structures are described above with respect to the fabrication processes.

Comparing with the existing fabrication technologies of a semiconductor device, the disclosed methods may having following advantages.

For example, in the disclosed fabrication method of a semiconductor device, before forming the metal layer, an oxide layer may be formed on each of the doped source/drain regions. Then, the metal layer may be formed on the oxide layers. A reactive thermal annealing process may be performed on the metal layer. The reactive thermal annealing process may cause the metal layer and the material of the doped source/drain regions to have an inter-diffusion and have a chemical reaction. Thus, a metal contact layer may be formed on each of the doped source/drain regions. The metal contact layer may include a first metal contact layer, an oxygen-containing metal contact layer on the first metal contact layer, and a second metal contact layer on the oxygen-containing metal contact layer. During the reactive thermal annealing process, because the oxide layers may have a barrier function to the inter-diffusion between the metal layer and the material of the doped source/drain regions, the forming rate of the metal contact layers may be relatively low. Thus, the uniformity of the thickness of the metal contact layers may be increased; and the resistance of the metal contact layers may be reduced. At the same time, because the metal contact layer may include the oxygen-containing metal contact layer between the first metal contact layer and the second metal contact layer, the metal contact layer may have dipoles. The dipoles may reduce the Schottky barrier height between the metal contact layers and the doped source/drain regions. Thus, the contact resistance between the metal contact layers and the doped source/drain regions may be reduced. Accordingly, the external parasitic resistance of the semiconductor device may be reduced. Thus, the electrical properties of the semiconductor device may be improved.

Further, a chemical soaking method may be used to oxidize the doped source/drain regions to form the oxide layers. The controllability of the thickness of the oxide layers may be acceptable; and the compactness of the oxide layers may be as desired. Thus, during the reactive thermal annealing process, the metal layer and the metal of the doped source/drain regions may inter-diffuse through such oxide layers to have a chemical reaction to form the metal contact layers.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a semiconductor device, comprising:
   providing a base substrate;
   forming gate structures over the base substrate;
   forming doped source/drain regions in the base substrate at two sides of each of the gate structures;
   forming an oxide layer on each of the doped source/drain regions;
   forming a metal layer on the oxide layer; and
   performing a reactive thermal annealing process, such that the metal layer reacts with a material of the oxide layer and a material of the doped source/drain regions to form a metal contact layer on each of the doped source/drain regions,
   wherein the metal contact layer includes a first metal contact layer on the doped source/drain region, an oxygen-containing metal contact layer on the first metal contact layer, and a second metal contact layer on the oxygen-containing metal contact layer,
   wherein the first metal contact layer is made of silicide, the oxygen-containing metal contact layer is made of oxysilicide, and the second metal contact layer is made of silicide.

2. The method according to claim 1, wherein forming the oxide layer comprises:
   performing an oxidation process on the doped source/drain regions.

3. The method according to claim 2, wherein:
   the oxidation process is a chemical soaking process.

4. The method according to claim 3, wherein:
   a mixture solution of sulfuric acid and hydrogen peroxide is used to perform the chemical soaking process to the doped source/drain regions;
   a volume ratio of sulfuric acid and hydrogen peroxide in the mixture solution is in a range of approximately 1:1 to 1:5; and
   a temperature of the mixture solution is in a range of approximately 120° C.-180° C.

5. The method according to claim 3, wherein:
   a mixture solution of ammonia and hydrogen peroxide is used to perform the chemical soaking process to the doped source/drain regions;
   a volume ratio of ammonia and hydrogen peroxide in the mixture solution is in a range of approximately 1:4 to 1:15; and
   a temperature of the mixture solution is in a range of approximately 25° C.-45° C.

6. The method according to claim 3, wherein:
   ozone-containing deionized water is used to perform the chemical soaking process.

7. The method according to claim 1, wherein:
   a thickness of the oxide layer is in a range of approximately 5 Å-30 Å.

8. The method according to claim 1, wherein:
   the metal layer is made of Ti.

9. The method according to claim 8, wherein:
   the first metal contact layer is made of titanium silicide;
   the oxygen-containing metal contact layer is made of titanium oxysilicide; and
   the second metal contact layer is made of titanium silicide.

10. The method according to claim 1, before forming the oxide layers, further comprising:
    forming a dielectric layer on a portion of the base substrate exposed by the gate structures and on the gate structures; and
    etching the dielectric layer to form through-holes passing through the dielectric layer and exposing at least a portion of each of the doped source/drain regions,
    wherein the through-holes expose the oxide layers on the doped source/drain regions.

11. The method according to claim 10, wherein:
    the metal layer is also formed on side surfaces of the through-holes and a top surface of the dielectric layer when forming the metal layer; and
    the metal contact layers are formed on the doped source/drain regions exposed by the through-holes.

12. The method according to claim 11, after forming the through-holes, further comprising:
    forming a conductive plug filling the through-hole and electrically connected with the metal contact layer in each of the through-holes.

13. The method according to claim 11, after forming the through-holes and before forming the conductive plugs, further comprising:

etching the dielectric layer to form openings exposing the gate structures in the dielectric layer; and forming gate plugs filling the openings and electrically connected with the gate structures in the openings for forming the conductive plugs.

14. The method according to claim 10, wherein the dielectric layer including an interlayer dielectric layer and a top dielectric layer above top surfaces of the gate structures, the interlayer dielectric layer leveling with or lower than the top surfaces of the gate structures, a gate-last process for forming the gate structures and the doped source/drain regions comprises:

forming dummy gate structures on the base substrate;

forming sidewall spacers on side surfaces of each of the dummy gate structures;

forming doped source/drain regions in the base substrate at two sides of each of the gate structures;

forming an interlayer dielectric layer exposing top surfaces of the gate structures and on a portion of the base substrate exposed by the dummy gate structures;

removing the dummy gate structures to form openings; and forming a gate structure in each of the openings.

15. The method according to claim 10, wherein a gate first process for forming the gate structures and the doped source/drain regions comprises:

forming gate structures on the base substrate;

forming sidewall spacers on side surfaces of each of the gate structures; and forming doped source/drain regions in the base substrate at two sides of each of the gate structures.

16. The method according to claim 1, after performing the reactive thermal annealing process, further comprising:

forming a dielectric layer on a portion of the base substrate exposed by the gate structures and on the gate structures;

etching through the dielectric layer to form through-holes passing through the dielectric layer and exposing surfaces of the second metal contact layers; and forming a conductive plug in each of the through-holes to fill the through-holes.

* * * * *